United States Patent
Wampler, II

(10) Patent No.: US 11,662,387 B1
(45) Date of Patent: May 30, 2023

(54) BATTERY STATE ESTIMATION USING AN EQUIVALENT CONSTANT CURRENT MODEL OF OVERPOTENTIAL

(71) Applicant: GM GLOBAL TECHNOLOGY OPERATIONS LLC, Detroit, MI (US)

(72) Inventor: Charles W. Wampler, II, Birmingham, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/589,053

(22) Filed: Jan. 31, 2022

(51) Int. Cl.
 *G01R 31/382* (2019.01)
 *G01R 31/367* (2019.01)
 *G01R 31/374* (2019.01)

(52) U.S. Cl.
 CPC ......... *G01R 31/382* (2019.01); *G01R 31/367* (2019.01); *G01R 31/374* (2019.01)

(58) Field of Classification Search
 None
 See application file for complete search history.

(56) References Cited

U.S. PATENT DOCUMENTS

| | | | |
|---|---|---|---|
| 10,901,042 B2 | 1/2021 | Verbrugge et al. | |
| 10,928,457 B2 | 2/2021 | Wampler, II | |
| 10,928,459 B2 | 2/2021 | Sun et al. | |
| 2002/0117997 A1* | 8/2002 | Feil | G01R 31/3648 320/132 |
| 2016/0216336 A1* | 7/2016 | Ishii | G01R 31/367 |

OTHER PUBLICATIONS

U.S. Appl. No. 17/679,380, filed Feb. 24, 2022, Wampler, II.

* cited by examiner

*Primary Examiner* — Jas A Sanghera

(57) ABSTRACT

A system includes a state of charge (SOC) calculation module configured to calculate an SOC of a battery cell based on a measured current of the battery cell and an overpotential calculation module configured to receive the measured current and output lagged currents based on the measured current and respective time constants, output a weighted measured current and weighted lagged currents based on a plurality of weighting factors, wherein a sum of the plurality of weighting factors is 1, calculate an equivalent constant current corresponding to the measured current based on the weighted measured current and the weighted lag currents, and calculate an overpotential of the battery cell based on the equivalent constant current. The system is configured to output a predicted voltage of the battery cell based on the calculated SOC and the calculated overpotential of the battery cell.

18 Claims, 4 Drawing Sheets

US 11,662,387 B1

BATTERY STATE ESTIMATION USING AN EQUIVALENT CONSTANT CURRENT MODEL OF OVERPOTENTIAL

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to vehicles and, more particularly, to battery systems of vehicles.

Some types of vehicles include only an internal combustion engine that generates propulsion torque. Pure electric vehicles include a battery system and an electric motor. Hybrid vehicles include both an internal combustion engine and one or more electric motors and may include a battery system. The battery system includes one or more batteries or battery modules. Each battery module includes one or more battery cells.

SUMMARY

A system includes a state of charge (SOC) calculation module configured to calculate an SOC of a battery cell based on a measured current of the battery cell and an overpotential calculation module configured to receive the measured current and output lagged currents based on the measured current and respective time constants, output a weighted measured current and weighted lagged currents based on a plurality of weighting factors, wherein a sum of the plurality of weighting factors is 1, calculate an equivalent constant current corresponding to the measured current based on the weighted measured current and the weighted lag currents, and calculate an overpotential of the battery cell based on the equivalent constant current. The system is configured to output a predicted voltage of the battery cell based on the calculated SOC and the calculated overpotential of the battery cell.

In other features, the overpotential calculation module includes a plurality of lagged current modules configured to calculate the lagged currents.

In other features, the lagged current modules correspond to low pass filters.

In other features, the weighting factors are functions of the SOC and a temperature of the battery cell.

In other features, the equivalent constant current is a sum of the weighted current and the weighted lagged currents.

In other features, the overpotential calculation module is configured to calculate the overpotential further based on the SOC and a temperature of the battery cell.

In other features, the overpotential calculation module is configured to calculate the overpotential using a lookup table.

In other features, the predicted voltage is a sum of an open circuit voltage and the overpotential.

In other features, the predicted voltage is a sum of an open circuit voltage, the overpotential, and a hysteresis voltage of the battery cell.

In other features, the system further includes a hysteresis module configured to calculate the hysteresis voltage of the battery cell.

A method includes calculating an SOC of a battery cell based on a measured current of the battery cell, receiving the measured current and outputting lagged currents based on the measured current and respective time constants, outputting a weighted measured current and weighted lagged currents based on a plurality of weighting factors, wherein a sum of the plurality of weighting factors is 1, calculating an equivalent constant current corresponding to the measured current based on the weighted measured current and the weighted lag currents, calculating an overpotential of the battery cell based on the equivalent constant current, and outputting a predicted voltage of the battery cell based on the calculated SOC and the calculated overpotential of the battery cell.

In other features, the method further includes outputting the lagged currents using low pass filters.

In other features, the weighting factors are functions of the SOC and a temperature of the battery cell.

In other features, the method further includes summing the weighted current and the weighted lagged currents to calculate the equivalent constant current.

In other features, the method further includes calculating the overpotential further based on the SOC and a temperature of the battery cell.

In other features, the method further includes calculating the overpotential using a lookup table.

In other features, the predicted voltage is a sum of an open circuit voltage and the overpotential.

In other features, the predicted voltage is a sum of an open circuit voltage, the overpotential, and a hysteresis voltage of the battery cell.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
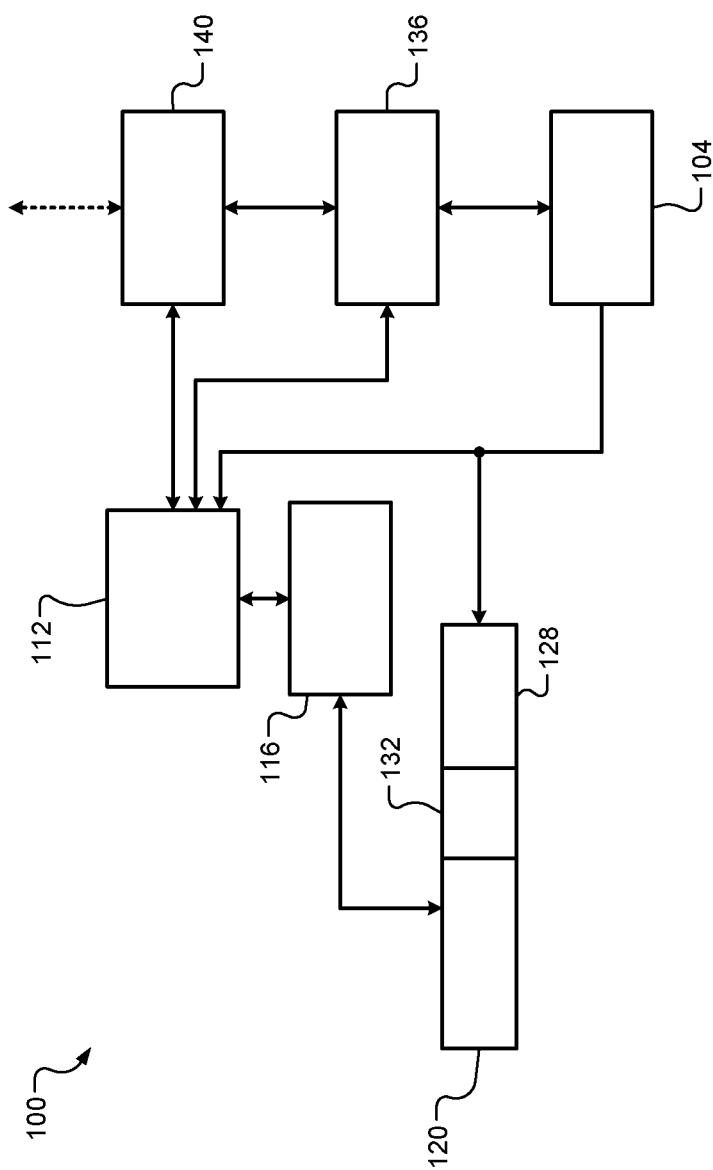
FIG. 1 is a functional block diagram of an example vehicle system according to the present disclosure.

Electric or hybrid electric vehicles typically include a battery system comprised of one or more rechargeable batteries or battery modules each including a plurality of battery cells (e.g., arranged in one or more battery packs). A battery management system (BMS) monitors various parameters of the battery system and controls the operation of the battery system. For example, the battery cells include solid or liquid electrolyte arranged between an anode and a cathode of the battery cell. Over the lifetime of the battery, performance of the battery may decrease due to one or more of electrolyte dry out, chemistry changes of the solid or liquid electrolyte, loss of active lithium, changes in the active materials of the battery cells, etc.

The BMS may be configured to calculate a battery state (e.g., a state of charge (SOC)) of the battery system. For example, the BMS may include (or, alternatively, communicate with) a battery state estimation module configured to estimate or calculate the SOC of the battery system. The battery state estimation module may estimate the SOC based on battery characteristics including, but not limited to, measured current, temperature, measured terminal voltage, a voltage predicted by a battery state model, etc. In some examples, the battery state model calculates the predicted voltage based on (e.g., a sum of) an open circuit voltage, a hysteresis voltage, and an overpotential.

In some examples, the overpotential is modeled in accordance with an equivalent circuit such that a total overpotential is a sum of voltages across a resistor and a plurality of resistor capacitor (RC) pairs. In other examples, the equivalent circuit is replaced by a bank of low-pass filters, each having a predetermined time constant, that output lagged versions of a measured input current (i.e., lagged currents). The measured input current and each of the lagged currents is multiplied by a resistance to determine a respective voltage component, and the respective voltage components are summed to calculate the total overpotential. An example model of overpotential based on lagged current is described in more detail in U.S. Pat. No. 10,928,457, the entirety of which is incorporated herein by reference.

Battery management systems and methods according to the present disclosure is configured to calculate the overpotential using a model of equivalent (or, "universal") constant current. For example, the equivalent constant current is modeled based the measured input current and each of the lagged currents. The measured input current and each of the lagged currents are multiplied by a respective weighting factor and summed to calculate the equivalent constant current (Lice). A sum of the weighting factors is 1. Accordingly, the calculated equivalent constant current is an approximation of a measured current that has been relatively constant for a predetermined period. For example, the equivalent constant current corresponds to an interpolation between fully-developed constant current behavior of the battery and transient behavior of the battery.

A function $\eta(I, x, T)$ provides an overpotential of the battery at a state of charge x and a temperature T for a current I when current has been relatively constant at I for a predetermined period. Accordingly, when the current I is replaced with the equivalent constant current, an overpotential $V_{over}$ can be calculated in accordance with $V_{over} = \eta(u_{cc}, x, T)$. For example, the function $\eta(u_{cc}, x, T)$ may be implemented as a multidimensional lookup table, a mathematical model of the battery or battery cell, etc.

Although described herein with respect to vehicle batteries (e.g., rechargeable batteries for electric or hybrid vehicles), the principles of the present disclosure may be applied to batteries used in non-vehicle applications.

Referring now to FIG. 1, a functional block diagram of an example vehicle system 100 including a battery pack or system 104 according to the present disclosure is shown. The vehicle system 100 may correspond to an autonomous or non-autonomous vehicle. The vehicle may be an electric vehicle (as shown). In other examples, the principles of the present disclosure may be implemented in a hybrid electric vehicle or a non-vehicle application.

A vehicle control module 112 controls various operations of the vehicle system 100 (e.g., acceleration, braking, etc.). The vehicle control module 112 may communicate with a transmission control module 116, for example, to coordinate gear shifts in a transmission 120. The vehicle control module 112 may communicate with the battery system 104, for example, to coordinate operation of an electric motor 128. While the example of one electric motor is provided, multiple electric motors may be implemented. The electric motor 128 may be a permanent magnet electric motor, an induction motor, or another suitable type of electric motor that outputs voltage based on back electromagnetic force (EMF) when free spinning, such as a direct current (DC) electric motor or a synchronous electric motor. In various implementations, various functions of the vehicle control module 112 and the transmission control module 116 may be integrated into one or more modules.

Electrical power is applied from the battery system 104 to the electric motor 128 to cause the electric motor 128 to output positive torque. For example, the vehicle control module 112 may include an inverter or inverter module (not shown) to apply the electrical power from the battery system 104 to the electric motor 128. The electric motor 128 may output torque, for example, to an input shaft of the transmission 120, to an output shaft of the transmission 120, or to another component. A clutch 132 may be implemented to couple the electric motor 128 to the transmission 120 and to decouple the electric motor 128 from the transmission 120. One or more gearing devices may be implemented between an output of the electric motor 128 and an input of the transmission 120 to provide one or more predetermined gear ratios between rotation of the electric motor 128 and rotation of the input of the transmission 120.

A battery management system (BMS) 136 is configured to control functions of the battery system 104 including, but not limited to, controlling switching of individual battery modules or cells of the battery system 104, monitoring operating parameters, diagnosing faults, etc. The battery management system 136 may be further configured to communicate with a telematics module 140.

The battery management system 136 according to the present disclosure is configured to calculate a battery state (e.g., a state of charge (SOC) and a corresponding predicted battery voltage) of individual cells of the battery system 104. For example, the battery management system 136 may include (or, alternatively, communicate with) a battery state estimation module configured to estimate or calculate the predicted voltage based in part on an overpotential. For example, the battery state estimation module calculates the overpotential based on an equivalent constant current as described below in more detail.

Figure 2:
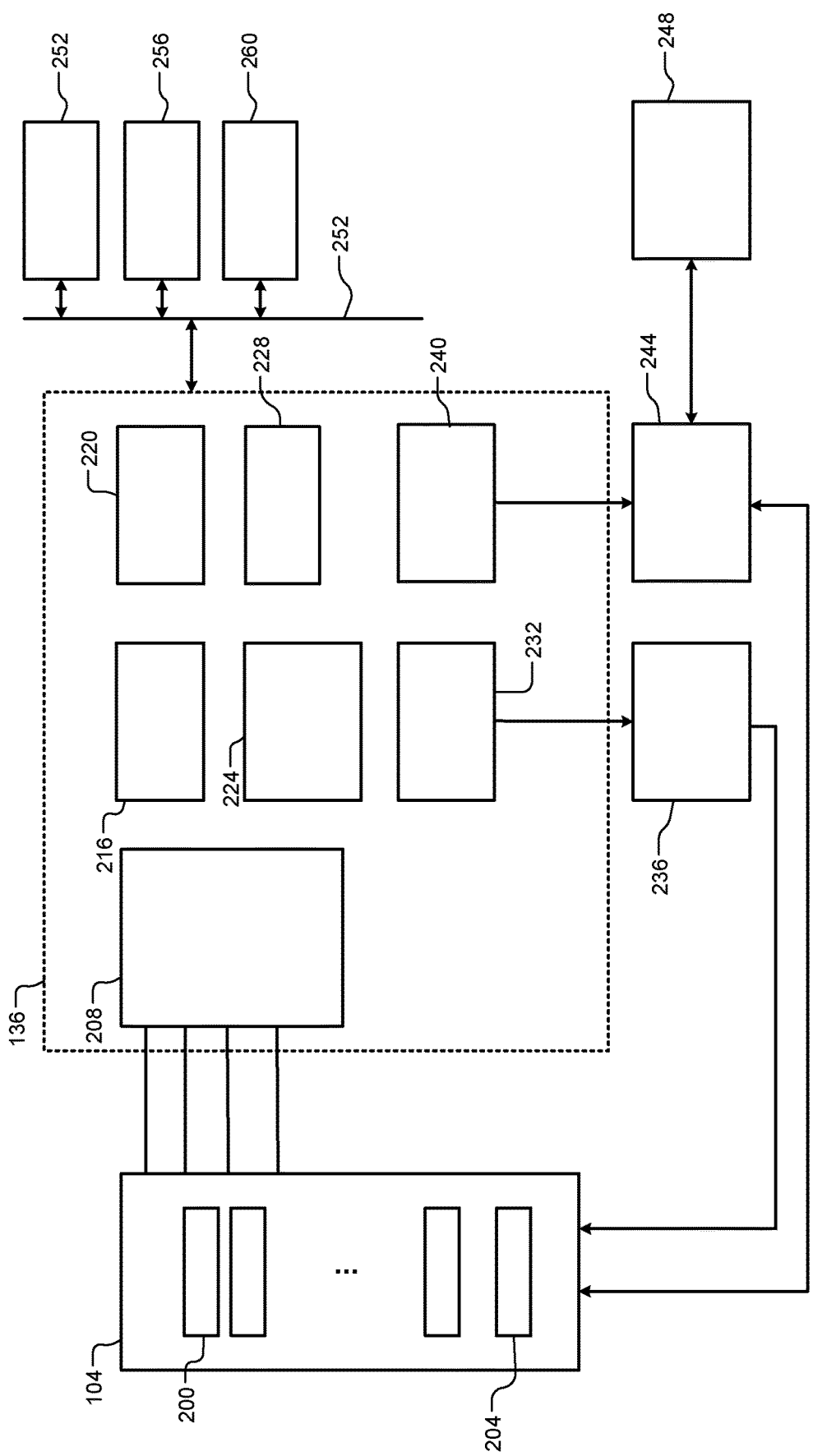
FIG. 2 is a functional block diagram of an example of a battery management system according to the present disclosure.

Referring now to FIG. 2, an example of a battery system 104 and a battery management system 136 is shown in more detail. The battery system 104 includes a plurality of battery cells 200 and one or more sensors 204 (such as voltage, current, temperature, etc.). The battery management system 136 includes a measurement module 208 that coordinates measurement of values from a battery cell and/or pack level. Examples of values include temperatures $T_1, T_2, \ldots$, voltages $V_1, V_2, \ldots$, currents $I_1, I_2, \ldots$, reference voltages $V_{ref1}, V_{ref2}, \ldots$, etc. (e.g., corresponding to respective ones of the battery cells 200).

A state of health (SOH) module 216 calculates a SOH of the battery system 104 and/or individual ones of the battery cells 200. A scheduling and history module 220 schedules testing of the battery cells 200 at predetermined periods (e.g. operating time, cycles, etc.), in response to predetermined events and/or in response to other factors and stores historical data. A battery state estimation module 224 determines a state (e.g., the SOC) of the battery system 104 and/or the battery cells 200. The battery state estimation module 224 according to the present disclosure determines a predicted voltage using the SOC and an overpotential based on an equivalent constant current as described below in more detail. Although the battery state estimation module 224 is shown within the battery management system 136, in other examples the battery state estimation module 224 may be external to the battery management system 136.

Calibration data storage 228 stores thresholds, parameters and/or other data related to calibration of the battery system. A thermal management module 232 communicates with a temperature controller 236 to control a temperature of the battery system 104 such as by adjusting coolant flow, airflow, and/or other parameters. A power control module 240 controls a power inverter 244 connecting the battery system 104 to one or more loads 248 (e.g., vehicle loads). The battery management system 136 communicates via a vehicle data bus 252 with a propulsion controller 256, one or more other vehicle controllers 260, and/or a telematics controller 264. The components and functions of the battery management system 136 as describe above are presented for example only and other examples of the battery management system may include or omit various modules and associated functions.

Figures 3, 4:
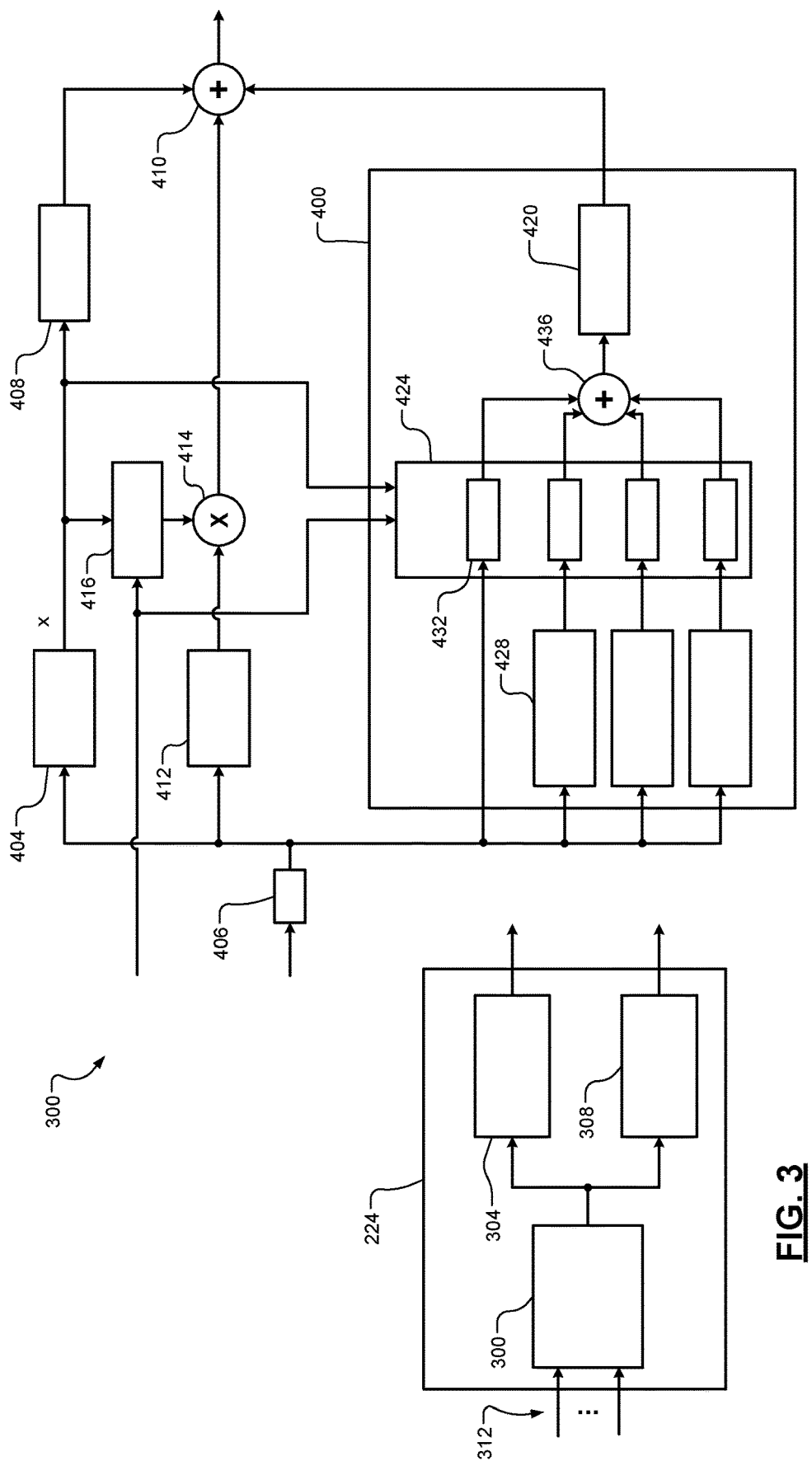
FIG. 3 is a function block diagram of an example battery state estimation module according to the present disclosure.
FIG. 4 is a functional block diagram of an example transient dynamics module according to the present disclosure.

Referring now to FIG. 3, an example of the battery state estimation module 224 is shown in more detail. The battery state estimation module 224 includes a transient dynamics module 300, a transient state of power (SOP) module 304, and a steady-state SOC module 308. The transient SOP module 304 and the steady-state SOC module 308 receive full battery state (which is calculated in part using a predicted voltage) calculated by the transient dynamics module 300 and calculate a transient SOP and steady-state SOC, respectively, based on the battery state.

For example, the transient dynamics module 300 implements a transient dynamics model (e.g., a model of transient dynamics) and a Kalman filter that updates the transient dynamics model based on actual battery behavior and calculates and outputs the battery state accordingly. For example, the transient dynamics module 300 receives battery measurements such as current, voltage, and temperature, updates its estimate of the battery state using these measurements and its prior estimate of the battery state, and predicts the battery voltage using the transient dynamics model. In one example, the difference between the predicted voltage and the measured voltage is used as a feedback signal to correct the battery state estimate. This correction is calculated as the product of a Kalman gain matrix and the feedback signal. A Kalman gain matrix can be calculated by any one of several approaches known to those skilled in the art as the Extended Kalman Filter, the Sigma-Point Kalman Filter, or other related variations.

The transient dynamics module 300 is further configured to calculate the battery state of the battery system 104 using the overpotential based on the equivalent constant current in accordance with the principles of the present disclosure. For example, the transient dynamics model of the transient dynamics module 300 calculates the SOC, equivalent constant current, overpotential, and predicted voltage based on estimates or measurements 312 including, but not limited to, currents, temperatures, and/or voltages of the battery cells 200.

Referring now to FIG. 4, an example of the transient dynamics module 300 is described in more detail. The transient dynamics module 300 receives measured battery cell temperatures T and currents I and calculates a respective state of charge SOC (e.g., based on a Coulomb count, where x=SOC), open circuit voltage Voc, hysteresis voltage $V_{hys}$, and overpotential $V_{over}$ based on the temperature and current. For example, the transient dynamics module 300 includes an overpotential calculation module 400 configured to calculate the overpotential according to the principles of the present disclosure. The transient dynamics module 300 calculates a predicted voltage based on (e.g., based on a sum of) the open circuit voltage, hysteresis voltage, and overpotential.

For example, the measured current is provided to an SOC calculation module (e.g., a Coulomb counter 404) configured to measure an amount of current consumption to calculate the SOC of the battery cell. The current I provided to the Coulomb counter 404 is divided by capacity Q (i.e., multiplied by 1/Q as shown at 406) to obtain the rate of change of SOC, which is often referred to as C-rate and has units of reciprocal time. The Coulomb counter 404 integrates this rate of change to obtain the present SOC, denoted x in FIG. 4. The open circuit voltage is calculated as a function of the SOC (e.g., using an open circuit voltage calculator 408, where Voc=OCV(x)) and provided to summer 410.

The current is also provided to hysteresis module 412, which calculates the hysteresis state corresponding to a hysteresis between charge and discharge voltages, where the state is +1 for steady charging, −1 for steady discharging, and has intermediate values when the direction of current changes. The hysteresis state is multiplied (e.g., using multiplier 414) by an output of a voltage gap calculator 416, which is configured to calculate a voltage gap $V_{gap}$ as a function of temperature and SOC.

The voltage gap corresponds to a hysteresis half-gap. A voltage required to charge a battery is greater than a voltage that is recovered from the battery during discharge. A hysteresis gap is the difference between the voltage required to charge the battery (a charging voltage) and the voltage recovered from the battery during discharge (a discharging voltage), which may vary based state of charge, temperature, battery type and materials, etc. Typically, if a battery rests in an open circuit state for an extended period, the battery voltage settles near a half-way point between the charging voltage and the discharging voltage, which corresponds to an open circuit voltage. The voltage gap can be calculated as a function of the open circuit voltage, the charging or discharging voltage, and a voltage overpotential. The product of the hysteresis state and the voltage gap is provided to the summer 410.

The overpotential calculation module 400 is configured to calculate an equivalent constant current $u_{cc}$ and calculate the overpotential in accordance with an overpotential function or model 420. For example, the overpotential model 420 models the overpotential as a function of the equivalent constant current, the SOC, and the temperature in accordance with $\eta(u_{cc}, x, T)$, which may be implemented as a multidimensional lookup table, a mathematical model of the battery cell, etc.

For example, a weighting module 424 receives the measured current and one or more lagged currents. Each of the lagged currents corresponds to the measured current as modified in accordance with a respective lagged current module 428. For example, the lagged current modules 428 are implemented as low pass filters having different (e.g., progressively longer) time constants. The lagged current modules 428 each output a lagged current in accordance with a respective time constant as described in U.S. Pat. No. 10,928,457. A number or quantity of the lagged current modules 428 and magnitudes of the time constants may vary in accordance with observed and/or modeled characteristics of respective battery cells. For example only, three of the lagged current modules 428 are shown. Although shown being provided directly to the weighting module 424, in some examples the measured current may be provided to the weighting module 424 through a high pass filter.

The weighting module 424 applies weighting factors 432 to the current and the lagged currents (e.g., multiplies the current and lagged currents by respective weighting factors 432) and outputs weighted currents and lagged currents. The weighted currents and lagged currents are summed (e.g., at summer 436) to generate a weighted sum, which corresponds to the equivalent constant current $u_{cc}$.

The weighting factors 432 correspond to functions of $\eta(x, T)$, where r is a calibrated weight. More specifically, $r_0(x, T)$ through $r_3(x, T)$ are calibrated weights selected such that $\Sigma_i r_i(x, T)=1$. In this manner, the calculated equivalent constant current is an approximation of a measured current that has been relatively constant for a predetermined period, and the overpotential module 420 calculates the overpotential in accordance with an equivalent constant current that is a weighted sum of the measured current and a plurality of lagged currents having progressively longer time constants. The overpotential is summed with the open circuit voltage and hysteresis voltage to generate the predicted voltage.

While the terms current, lagged current, and equivalent constant current are used above. FIG. 4 the signal input to the overpotential calculation module 400 is shown as a C-rate, (I/Q). In this example, the terms C-rate, lagged C-rate, and equivalent constant C-rate replace the current, lagged current, and equivalent constant current. The principle of operation in this example is analogous to that of a calculation using current, lagged current, and equivalent constant current so long as the overpotential function $\eta(u_{cc}, x, T)$ accounts for the scaling factor. A formulation in terms of C-rate is preferred for scale independence and for more naturally adapting to battery degradation as the capacity Q decreases with battery age and use.

Figure 5:
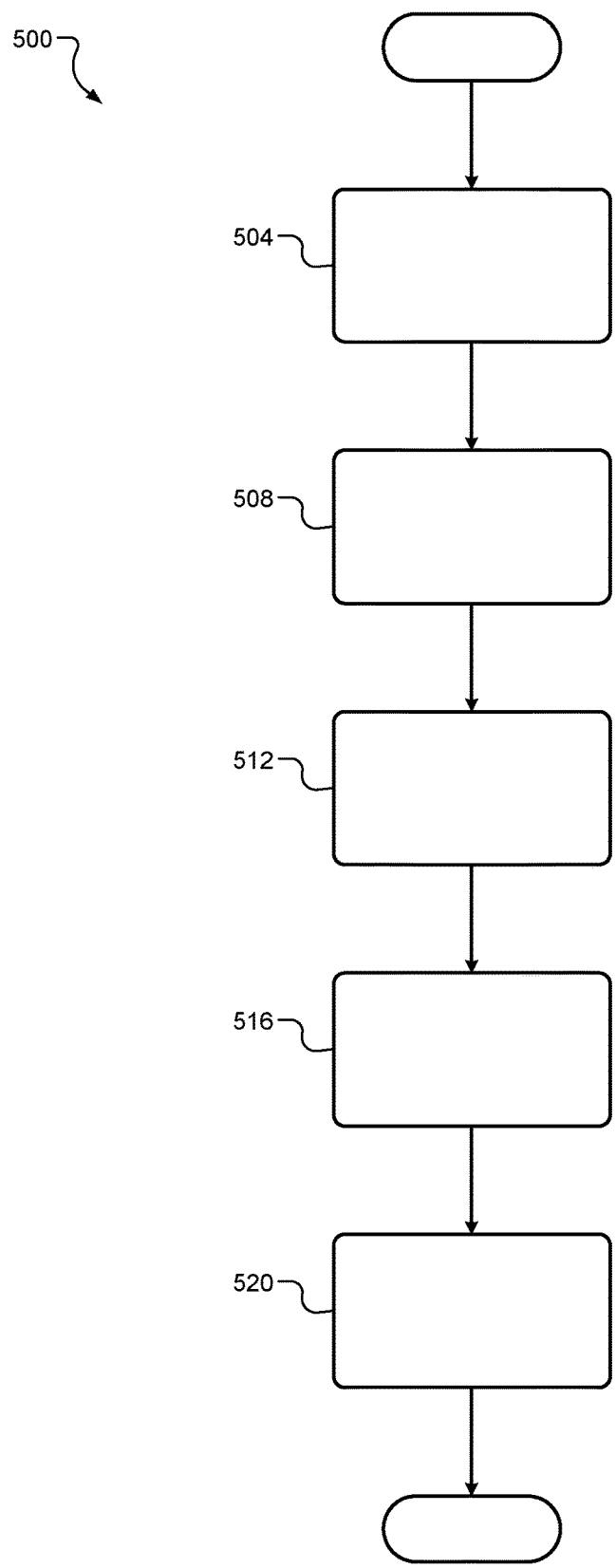
FIG. 5 illustrates steps of an example method for calculating an overpotential of a battery cell according to the present disclosure.

Referring now to FIG. 5, an example method 500 (e.g., as implemented by the battery management system 136, battery estimation module 224, transient dynamics module 300, etc.) for calculating an overpotential of a battery cell according to the present disclosure is shown. At 504, the method 500 measures one or more battery operating characteristics indicative of SOC, hysteresis, and overpotential, such as measured current and temperature. At 508, the method 500 calculates lagged currents based on the measured current.

At 512, the method 500 calculates an equivalent constant current corresponding to the measured current. For example, the equivalent constant current is a weighted sum of the measured current and the lagged currents. In one example, the method 500 calculates the weighted sum based on respective weighting factors multiplied by each of the measured current and the lagged currents, and a sum of the weighting factors is 1.

At 516, the method 500 calculates the overpotential based on the equivalent constant current. For example, the method 500 calculates the overpotential in accordance with $\eta(u_{cc}, x, T)$. At 520, the method 500 calculates a predicted voltage of the battery cell based on the overpotential, the hysteresis voltage, and the SOC (e.g., an open circuit voltage calculated in accordance with the SOC).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system, comprising:
a state of charge (SOC) calculation module configured to calculate an SOC of a battery cell based on a measured current of the battery cell; and
an overpotential calculation module configured to
receive the measured current and output lagged currents based on the measured current and respective time constants,
output a weighted measured current and weighted lagged currents based on a plurality of weighting factors, wherein a sum of the plurality of weighting factors is 1,
calculate an equivalent constant current corresponding to the measured current based on the weighted measured current and the weighted lag currents, and
calculate an overpotential of the battery cell based on the equivalent constant current,
wherein the system is configured to output a predicted voltage of the battery cell based on the calculated SOC and the calculated overpotential of the battery cell.

2. The system of claim 1, wherein the overpotential calculation module includes a plurality of lagged current modules configured to calculate the lagged currents.

3. The system of claim 2, wherein the lagged current modules correspond to low pass filters.

4. The system of claim 1, wherein the weighting factors are functions of the SOC and a temperature of the battery cell.

5. The system of claim 1, wherein the equivalent constant current is a sum of the weighted current and the weighted lagged currents.

6. The system of claim 1, wherein the overpotential calculation module is configured to calculate the overpotential further based on the SOC and a temperature of the battery cell.

7. The system of claim 6, wherein the overpotential calculation module is configured to calculate the overpotential using a lookup table.

8. The system of claim 1, wherein the predicted voltage is a sum of an open circuit voltage and the overpotential.

9. The system of claim 1, wherein the predicted voltage is a sum of an open circuit voltage, the overpotential, and a hysteresis voltage of the battery cell.

10. The system of claim 9, further comprising a hysteresis module configured to calculate the hysteresis voltage of the battery cell.

11. A method, comprising:
calculating an SOC of a battery cell based on a measured current of the battery cell;
receiving the measured current and outputting lagged currents based on the measured current and respective time constants;
outputting a weighted measured current and weighted lagged currents based on a plurality of weighting factors, wherein a sum of the plurality of weighting factors is 1;
calculating an equivalent constant current corresponding to the measured current based on the weighted measured current and the weighted lag currents;
calculating an overpotential of the battery cell based on the equivalent constant current; and outputting a predicted voltage of the battery cell based on the calculated SOC and the calculated overpotential of the battery cell.

12. The method of claim 11, further comprising outputting the lagged currents using low pass filters.

13. The method of claim 11, wherein the weighting factors are functions of the SOC and a temperature of the battery cell.

14. The method of claim 11, further comprising summing the weighted current and the weighted lagged currents to calculate the equivalent constant current.

15. The method of claim 11, further comprising calculating the overpotential further based on the SOC and a temperature of the battery cell.

16. The method of claim 15, further comprising calculating the overpotential using a lookup table.

17. The method of claim 16, wherein the predicted voltage is a sum of an open circuit voltage and the overpotential.

18. The method of claim 11, wherein the predicted voltage is a sum of an open circuit voltage, the overpotential, and a hysteresis voltage of the battery cell.

* * * * *